(12) United States Patent
Tang

(10) Patent No.: US 11,355,731 B2
(45) Date of Patent: Jun. 7, 2022

(54) DISPLAY PANEL INCLUDING PERIPHERAL HOLES EXPOSING DAMS

(71) Applicant: WUHAN CHINA STAR OPTOELECTRONICS SEMICONDUCTOR DISPLAY TECHNOLOGY CO., LTD., Hubei (CN)

(72) Inventor: Rui Tang, Hubei (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 262 days.

(21) Appl. No.: 16/642,299

(22) PCT Filed: Jan. 20, 2020

(86) PCT No.: PCT/CN2020/073113
§ 371 (c)(1),
(2) Date: Feb. 26, 2020

(87) PCT Pub. No.: WO2021/047140
PCT Pub. Date: Mar. 18, 2021

(65) Prior Publication Data
US 2021/0408462 A1    Dec. 30, 2021

(30) Foreign Application Priority Data
Sep. 12, 2019  (CN) .......................... 201910863382.3

(51) Int. Cl.
*H01L 51/52* (2006.01)
*H01L 27/32* (2006.01)

(52) U.S. Cl.
CPC ...... *H01L 51/5253* (2013.01); *H01L 27/3246* (2013.01); *H01L 27/3244* (2013.01);
(Continued)

(58) Field of Classification Search
CPC ............ H01L 51/5253; H01L 27/3246; H01L 27/3295; H01L 2251/301; H01L 51/5246;
(Continued)

(56) References Cited

U.S. PATENT DOCUMENTS 10,170,534 B1 * 1/2019 Kim ................. H01L 27/3258
10,642,390 B2 * 5/2020 Lee .................... G06F 3/0443
(Continued)

FOREIGN PATENT DOCUMENTS

CN     207637803 U     7/2018
CN     109244261 A     1/2019
(Continued)

*Primary Examiner* — Ida M Soward

(57) ABSTRACT

A display panel disclosed in the application includes a display region and a peripheral region. The display panel includes a substrate and at least one dam disposed on the substrate. The dam is in the peripheral region. An anode is disposed on the substrate and is in the peripheral region. A plurality of holes is provided on the anode to expose the dam. In a direction which the display region faces the peripheral region, a size of the holes is greater than a size of the dam.

15 Claims, 6 Drawing Sheets

(52) U.S. Cl.
CPC ...... *H01L 27/3248* (2013.01); *H01L 27/3258* (2013.01); *H01L 27/3274* (2013.01); *H01L 51/5209* (2013.01); *H01L 51/5296* (2013.01); *H01L 2251/301* (2013.01)

(58) Field of Classification Search
CPC ............. H01L 51/5291; H01L 51/5209; H01L 27/3244; H01L 27/3248; H01L 27/3279; H01L 27/3274; H01L 27/3258; H01L 27/3297; H01L 27/3272; G02F 2001/133357
See application file for complete search history.

(56) References Cited

U.S. PATENT DOCUMENTS

| | | | |
|---|---|---|---|
| 11,289,553 B2* | 3/2022 | Lee | H01L 51/56 |
| 2017/0117502 A1* | 4/2017 | Park | H01L 51/56 |
| 2017/0345881 A1* | 11/2017 | Kim | H01L 51/5253 |
| 2018/0183004 A1 | 6/2018 | Shin | |
| 2019/0355930 A1* | 11/2019 | Lee | H01L 51/5253 |
| 2021/0098548 A1* | 4/2021 | Ochi | H01L 27/3258 |
| 2021/0118344 A1* | 4/2021 | Kim | G09G 3/3291 |
| 2021/0143238 A1* | 5/2021 | Kim | H01L 51/5246 |
| 2021/0257424 A1* | 8/2021 | Byun | H01L 27/3276 |

FOREIGN PATENT DOCUMENTS

| | | | |
|---|---|---|---|
| CN | 109545831 A | 3/2019 | |
| CN | 109920827 A | 6/2019 | |
| CN | 110120463 A | 8/2019 | |

* cited by examiner

DISPLAY PANEL INCLUDING PERIPHERAL HOLES EXPOSING DAMS

CROSS REFERENCE TO RELATED APPLICATIONS

The present disclosure claims priority to Chinese Patent Application No. 201910863382.3, titled "Display Panel", filed with the National Intellectual Property Administration on Sep. 12, 2019, the disclosure, which is incorporated herein by reference in its entirety.

FIELD OF INVENTION

The present disclosure relates to the field of display technologies, more particularly to a display panel.

BACKGROUND OF INVENTION

Thin-film transistor (TFT) liquid crystal displays (LCDs) are mainstream in market due to their mature manufacturing processes and stable mass production. In comparison with LCDs, organic light-emitting diodes (OLEDs) are viewed as new-generation display technologies and have prospects for a wider application due to their advantages of self-illumination, lower power consumption, and a flexible display.

However, OLED devices are sensitive to water and oxygen. Metal electrodes and organic light-emitting materials are susceptible to aging or electrochemical corrosion after encountering water and oxygen. In order to prevent the OLED devices from being damaged, it is necessary to perform thin-film encapsulation on the metal electrodes and the light-emitting materials to protect them.

SAMSUNG publishes encapsulation structures as shown in FIG. 1a and FIG. 1b in U.S. Pat. No. 9,419,247 which include a TFT substrate 100, a display area 200, an inorganic layer 310, an inorganic layer 330, and an organic layer 320. In order to limit the flow of the organic layer 320, in this embodiment, one or more dams 400 are formed in a peripheral area, and an anode 311 is deposited on the entire surface to form a film in the dam region, and is overlapped with a VSS signal line. However, in this embodiment, when performing a resistance test under high temperature and high humidity conditions, due to density change and stress change of a film layer at steps portions of the dam, peeling of the anode 311 may easily happen at the step portions of the dam or at interface between the anode 311 and other interlayers.

SAMSUNG publishes other encapsulation structures of dams as shown in FIG. 2a and FIG. 2b in U.S. Pat. No. 9,818,807. FIG. 2a and FIG. 2b illustrate one embodiment of dam of a display panel in existing technologies. There are three dams (D1, D2, and D3) provided in a peripheral area. The anode 710 is formed on the entire surface near the dam in the peripheral area. The dam also has a risk of film peeling at step portion. When the number of dams is increased, the steps of dams get higher, the risk of anode peeling become significantly higher.

FIG. 3a illustrates a diagram of a dam in existing technologies. FIG. 3b illustrates a cross-sectional view of an anode near the dam in the existing technologies. In the existing technologies, a display panel includes a display region 10 and a region 20 surrounding the display region 10. In the peripheral region 10, the display panel includes a substrate 1, a dam 3, an anode 4, and a thin-film packaging layer 5 which are stacked in sequence. In the peripheral region 20, the substrate 1 includes a base substrate 11, a gate insulation layer 12, an interlayer dielectric layer 13, and a source drain layer 2 which are stacked on each other. The source drain layer 2 is a metal layer. The dam 3 is disposed on one side of the source drain layer 2 away from the substrate 1. The dam 3 includes a first dam 31 and a second dam 32. The first dam 31 is located between the display region 10 and the second dam 32. A separate region 33 is disposed between the first dam 31 and the second dam 32. The dam 3 includes a first inorganic layer 34 and a second inorganic layer 35, which are stacked. The thin-film packaging layer 5 includes at least a first inorganic packaging layer 51, a second organic packaging layer 52, and a second inorganic packaging layer 53, which are stacked. The first inorganic packaging layer 51 covers the anode 4. The anode 4 covers a whole surface of the dam 3. The peeling risk of the anode is higher during the endurance test.

As a result, a display panel is urgently required to solve the above-mentioned problems.

Technical Problems

The present disclosure provides a display panel that exposes a dam by disposing a plurality of holes on an anode. The size of the holes is greater than the size of the dam so that the first inorganic packaging layer of the thin-film packaging layer is in contact with the first inorganic layer and the second inorganic layer of the dam at the holes. Thus, the adhesive strength is much greater than the adhesive strength between the first inorganic packaging layer and the anode. This can effectively prevent peeling risk of the anode near the dam, especially at a slope region and can further inhibit a partial peeling of the dam from extending to the display region, thereby improving the high-reliability packaging effect of OLED devices.

SUMMARY OF INVENTION

Technical Solutions

First, the embodiment of the present disclosure provides a display panel comprising a display region and a peripheral region surrounding the display region, wherein the display panel comprises:

A substrate.

At least one dam disposed on the substrate and disposed in the peripheral region.

An anode disposed on the substrate. A plurality of holes are provided on the anode in the peripheral region to expose the dam, the plurality of holes are arranged along an extending direction of the dam, the hole are arranged in a line or stagger along a direction extending from the display region toward the peripheral region, and a size of the hole is greater than a size of the dam in the direction extending from the display region toward the peripheral region.

A second hole provided on a source drain layer of the substrate, wherein the second hole corresponds to the holes on the anode.

Furthermore, the dam comprises at least a first dam and a second dam, the first dam is disposed between the display region and the second dam, and a separate region is defined between the first dam and the second dam.

Furthermore, the display panel further comprises a thin-film packaging layer, and a first inorganic packaging layer of the thin-film packaging layer contacts to the dam through the holes and the second hole.

Furthermore, the size of the hole along the extending direction of the dam is 5 μm-500 μm, the size of the hole in the direction extending from the display region toward the peripheral region is greater than 5 µm, and an interval between two adjacent one of the holes along the extending direction of the dam is greater than 10 µm.

Furthermore, the dam comprises a first inorganic layer and a second inorganic layer stacked to each other.

Second, the embodiment of the present disclosure provides a display region and a peripheral region surrounding the display region, wherein the display panel comprises:

A substrate.

At least one dam disposed on the substrate and disposed in the peripheral region.

An anode disposed on the substrate, wherein a least one of hole is provided on the anode in the peripheral region to expose the dam, and a size of the hole is greater than a size of the dam in a direction extending from the display region toward the peripheral region.

Furthermore, the dam comprises at least a first dam and a second dam, the first dam is disposed between the display region and the second dam, and a separate region is defined between the first dam and the second dam.

Furthermore, the display panel further comprises a thin-film packaging layer, and a first inorganic packaging layer of the thin-film packaging layer contacts to the dam through the hole.

Furthermore, a second hole is provided on a source drain layer of the substrate and corresponds to the holes on the anode, and the first inorganic packaging layer of the thin-film packaging layer contacts to the dam through the hole and the second hole.

Furthermore, a plurality of the hole is arranged along an extending direction of the dam, the holes are arranged in a line or stagger along the direction extending from the display region toward the peripheral region.

Furthermore, a size of the hole along the extending direction of the dam is 5 µm-500 µm, a size of the hole in the direction extending from the display region toward the peripheral region is greater than 5 µm, and an interval between two adjacent one of the holes along the extending direction of the dam is greater than 10 µm.

Furthermore, a size of the hole along the extending direction of the dam is greater than 5 µm, and an interval between two adjacent one of the holes along the extending direction of the dam is greater than 10 µm.

Furthermore, the dam comprises a first inorganic layer and a second inorganic layer stacked to each other.

Furthermore, the display panel further comprises a planarization layer, a pixel defining layer, and an organic light-emitting layer stacked to each other in the display region, the planarization layer and the first inorganic layer of the dam are disposed in the same layer and have a same material, the pixel defining layer and the second inorganic layer of the dam are disposed in the same layer and have a same material, the organic light-emitting layer comprises the anode, a light-emitting layer and a cathode stacked to each other, the substrate comprises a base substrate, a gate insulation layer, a interlayer dielectric layer, and the source drain layer stacked to each other in the peripheral region, and the planarization layer covers the source drain layer.

Furthermore, the thin-film packaging layer further comprises at least an organic packaging layer and a second inorganic packaging layer and the organic packaging layer and the second inorganic packaging layer are disposed on a side of the first inorganic packaging layer of the thin-film packaging layer away from the substrate.

Beneficial Effects

The advantage of the present disclosure is that the size of holes is greater than the size of a dam by providing a plurality of holes on an anode to expose the dam. A second hole corresponding to the holes on the anode is provided on a source drain layer. As a result, a first inorganic packaging layer of a thin-film packaging layer is in contact with a first inorganic layer and a second inorganic layer at the holes and at the second holes of the dam so that the adhesive strength is much greater than the adhesive strength between the first inorganic packaging layer and the anode. This can effectively prevent peeling risk of the anode near the dam, especially at a slope region and can further inhibit a partial peeling of the dam from extending to the display region, thereby improving the high-reliability packaging effect of OLED devices.

DESCRIPTION OF DRAWINGS

FIG. 4b illustrates a cross-sectional view of line A-A shown in FIG. 4a.

FIG. 6b illustrates a cross-sectional view of line C-C shown in FIG. 6a.

DETAILED DESCRIPTION OF PREFERRED EMBODIMENTS

The present disclosure provides a display panel. In order to clarify and specify the purposes, technical solutions, and effects of the present disclosure, the present disclosure will be further described in detail with reference to the accompanying drawings and examples. It should be understood that the specific embodiments described herein are only used to explain the present disclosure instead of limiting the present disclosure.

A Display Panel of a First Embodiment

Figure 1A:
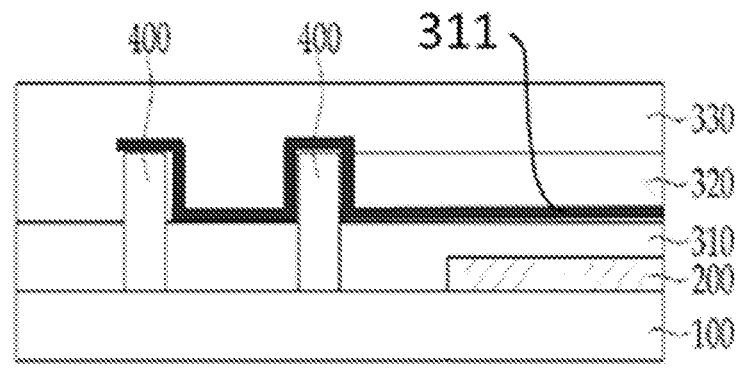
FIG. 1a and FIG. 1b illustrate a packaging structure of a display panel in existing technologies.
Figure 1B:
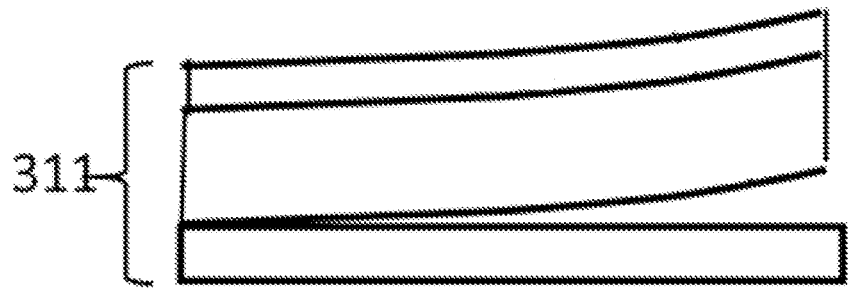
Figure 2A:
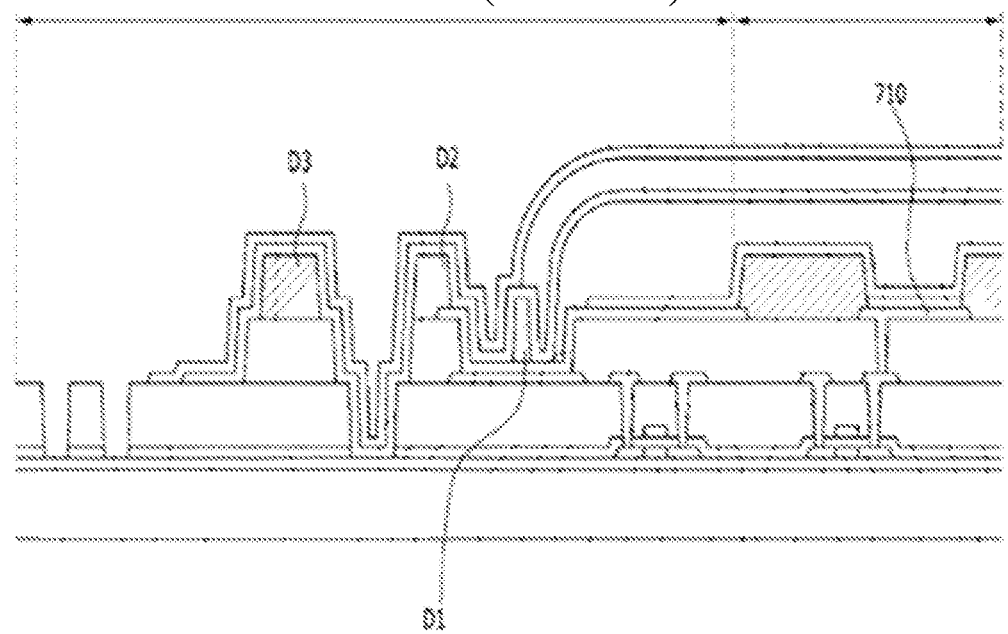
FIG. 2a and FIG. 2b illustrates a dam of the display panel in the existing technologies.
Figure 2B:
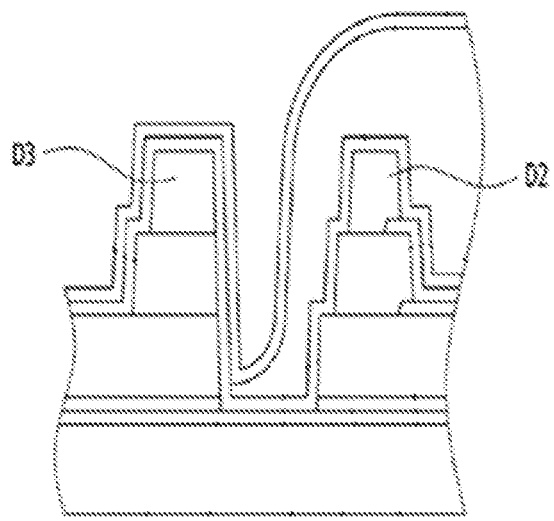
Figure 3A:
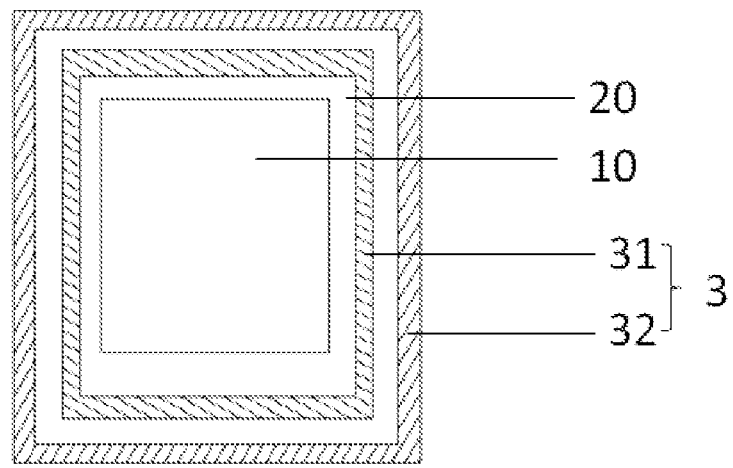
FIGS. 3a and 3b illustrate diagrams of the dam in the existing technologies.
Figure 3B:
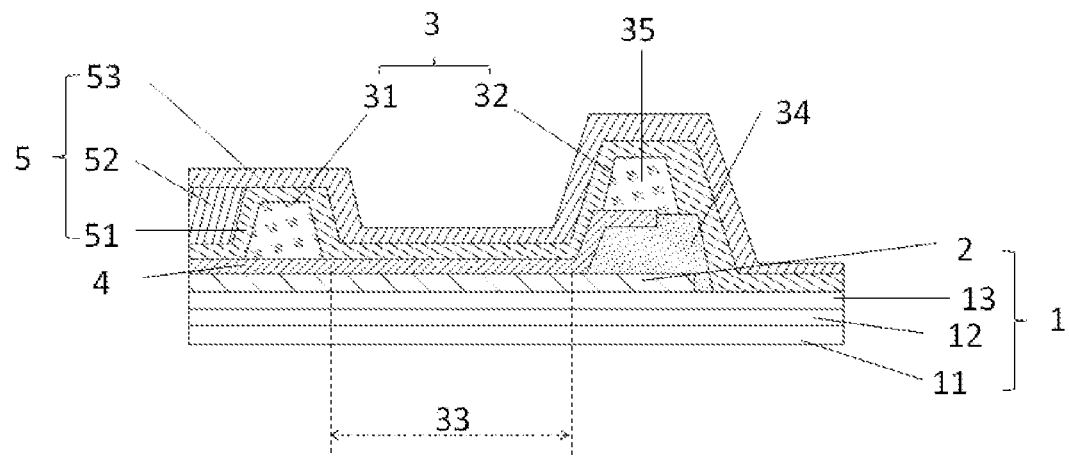
Figure 4A:
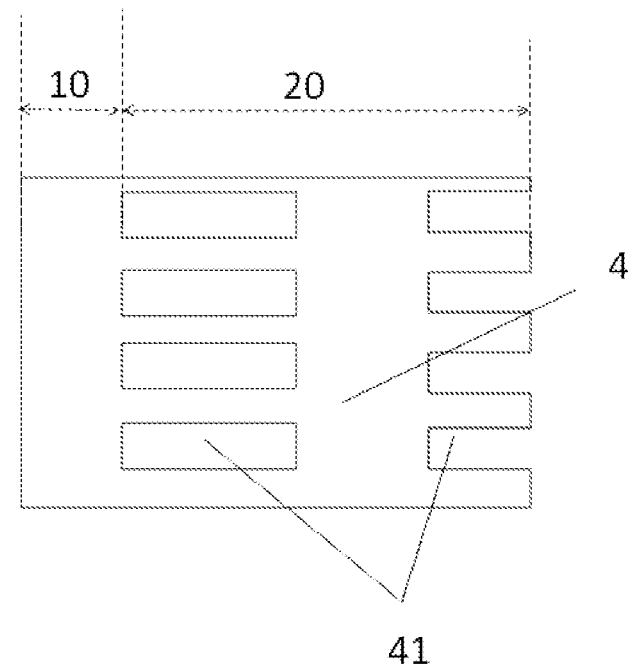
FIG. 4a illustrates a top view of an anode near the dam of a display panel of a first embodiment of the present disclosure.
Figure 4B:
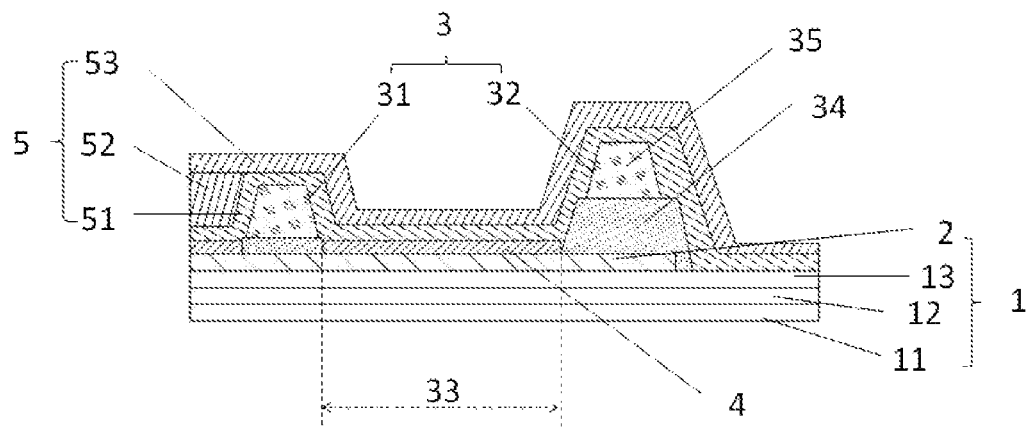

Please refer to FIG. 4a and FIG. 4b. FIG. 4a illustrates a top view of an anode near the dam of a display panel of the first embodiment. FIG. 4b illustrates a cross-sectional view of line A-A shown in FIG. 4a. In this embodiment, an organic light-emitting diode (OLED) display panel is provided. As shown in FIG. 4a and FIG. 4b, the display panel includes a display region 10 and a peripheral region 20 surrounding the display region 10.

In the peripheral region 20, the display panel includes a substrate 1, a plurality of dam 3, an anode 4, and a thin-film packaging layer 5 which are stacked in sequence. Specifically, the substrate 1 includes a base substrate 11, a gate insulation layer 12, an interlayer dielectric layer 13, and a source drain layer 2, which are metal layers. The dam 3 is disposed on a side of the interlayer dielectric layer 13 or the source drain layer 2 facing away from the base substrate 11. The dam 3 includes at least one first dam 31 and at least one second dam 32. The first dam 31 is located between the display region 10 and the second dam 32. A separate region 33 is disposed between the first dam 31 and the second dam 32. The dam 3 includes a first inorganic layer 34 and a second inorganic layer 35 which are stacked. The anode 4 is disposed on a side of the source drain layer 2 facing away from the base substrate 11. The anode 4 extends in a direction from the display region 10 toward the peripheral region 20 and reaches the second dam 32, and the anode 4 is electrically connected to the source drain layer 2.

Please refer FIG. 4a and FIG. 4b. In this embodiment, in the peripheral region 20, holes 41 are provided on the anode 4 to expose a first dam 31 and a second dam 32. In a direction from the display region 10 to the peripheral region 20, the size of the holes 41 is greater than the size of the dam 3. The thin-film packaging layer 5 includes at least one first inorganic packaging layer 51. The first inorganic packaging layer 51 penetrates through the holes 41 to be in contact with the first inorganic layer 34 and the second inorganic layer 35 of the dam 3.

Please refer FIG. 4a and FIG. 4b. In the display region 10, the display panel further includes the substrate 1, a planarization layer, a pixel defining layer, an organic light-emitting layer, and a thin-film packaging layer 5 stacked on one another. The planarization layer is a same layer and has same material as the first inorganic layer 34 of the dam 3. The planarization layer is disposed on the interlayer dielectric layer 13 or the source drain layer 2. The pixel defining layer and the second inorganic layer 35 of the dam 3 are provided on the same layer and are made of same material. The organic light-emitting layer includes the anode 4, a light-emitting layer and a cathode stacked to each other. The anode 4 is electrically connected to the source drain layer 2. The thin-film packaging layer 5 further includes at least one organic packaging layer 52 and a second inorganic packaging layer 53. The organic packaging layer 52 and the second inorganic packaging layer 53 are disposed on a side of the first inorganic packaging layer 51 facing away the substrate 1. A layer number of the thin-film packaging layer 5 is not specifically limited in this embodiment.

Please refer and FIG. 4b. In this embodiment, the substrate 1 is flexible. The substrate 1 provides support and protection for the display panel. The display panel can be deformed by bending, folding, and so on. A material of the base substrate 11 of the substrate 1 is polyimide. The material of the a base substrate 11 of the present disclosure is specifically limited Please refer FIG. 4a and FIG. 4b. In this embodiment, the shape of the holes 41 is rectangular, which is not specifically limited in other embodiments. A plurality of the holes 41 are arranged along the extending direction of the dam 3. In a direction which the first dam 31 faces the second dam 32, the holes 41 are arranged in same row or in a staggered manner. In this embodiment, it is arranged in same row.

Please refer FIG. 4a and FIG. 4b. In a region where the display region 10 extends to the first dam 31, the first inorganic packaging layer 51 is in contact with a side of the anode 4 facing away from the substrate 1. A side of the anode 4 close to the substrate 1 is directly in contact with the source drain layer 2. In a region corresponding to the first dam 31, because along a direction from the display region 10 to the peripheral region 20, the size of the holes 41 is greater than the size of the dam 3, the first inorganic packaging layer 51 can fully contact the first inorganic layer 34 and the second inorganic layer 35 of the first dam 31 through the holes 41. In the separate region 33 between the first dam 31 and the second dam 32, the first inorganic packaging layer 51 is in contact with the side of the anode 4 facing away from the substrate 1. The side of the anode 4 close to the substrate 1 is in direct contact with the source drain layer 2. In a region corresponding to the second dam 32, the first inorganic packaging layer 51 is in contact with the first inorganic layer 34 and the second inorganic layer 35 of the second dam 32 through the holes 41.

It should be noted that in this embodiment, the source drain layer 2 is in direct contact with the anode 4. That is, the source drain layer 2 is connected in parallel to the anode 4 in order to widen a greatest connecting width between the source drain layer 2 and the anode 4. This reduces resistance of the anode 4 and the source drain layer 2, thereby reducing resistance of the metal wires and influences of voltage drop resulting from the reduction of metal.

A Display Panel of a Second Embodiment

Figure 5A:
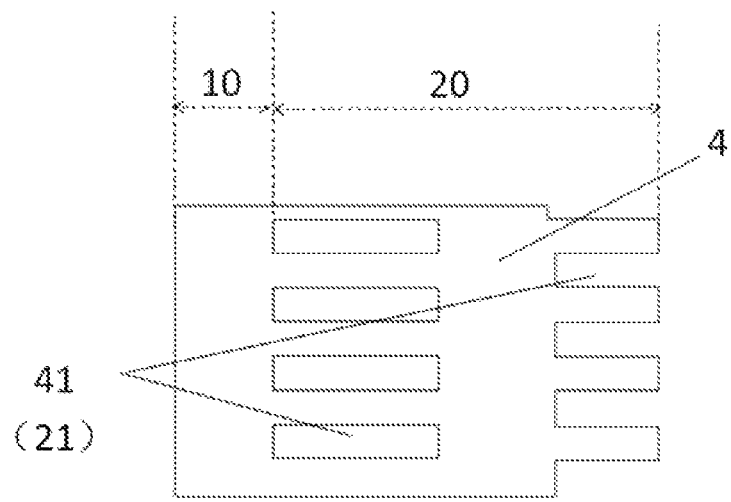
FIG. 5a illustrates a top view of an anode of a second embodiment of the present disclosure.
Figure 5B:
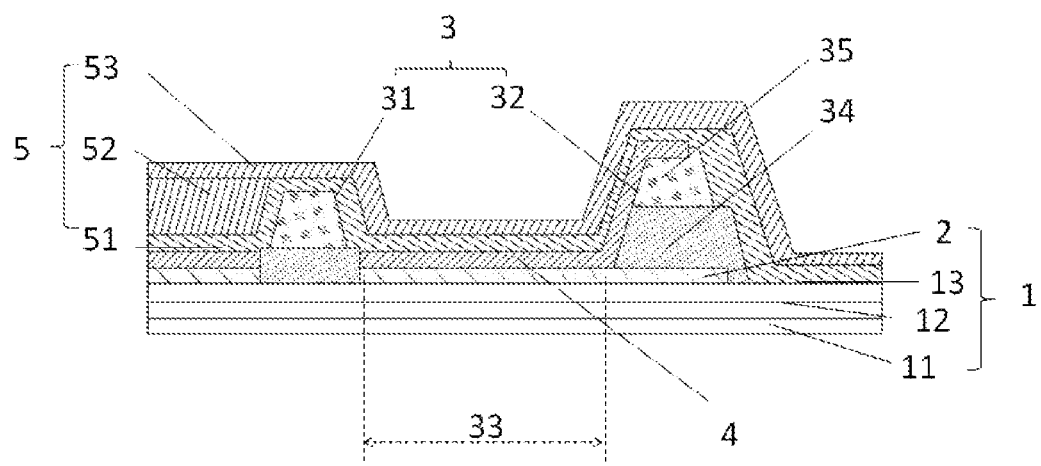
FIG. 5b illustrates a structural diagram of a source drain layer of a display panel of the second embodiment of the present disclosure.

Please refer to FIG. 5a and FIG. 5b. FIG. 5a is a top view of the anode in this embodiment. FIG. 5b is a schematic view of the source drain layer in the second embodiment. Differences between this embodiment and the first embodiment are that in this embodiment, a second hole 21 is provided on the source drain layer 2 of the substrate 1, the second hole 21 corresponds to the holes 41 on the anode 4, and the first inorganic packaging layer 51 of the thin-film packaging layer 5 is in contact with the first inorganic layer 34 and the second inorganic layer 35 of the dam 3 through the holes 41 and the second hole 21.

In addition, in a direction which the display region 10 faces the peripheral region 20, the holes 41 are arranged in same row or in a staggered manner. In this embodiment, the holes 41 of the anode 4 are in a staggered manner.

In the first embodiment and in this embodiment, in the peripheral region 20, the manufacturing processes of the display panel include sequentially forming the gate insulation layer 12 and the interlayer dielectric layer 13 on a base substrate 11. The source drain layer 2 is provided on the interlayer dielectric layer 13. The anode 4 is deposited on an entire surface on the source drain layer 2. The holes 41 are formed on the anode 4 corresponding to the first dam 31 and the second dam 32 by exposure, development, and etching. Furthermore, the second hole 21 is formed on the source drain layer 2. Entire surfaces of the first inorganic layer 34 and the second inorganic layer 35 are sequentially coated to form the first dam 31 and the second dam 32 respectively at the holes 41 of the anode 4. The first inorganic packaging layer 51 of the thin-film packaging layer 5 is coated on the anode 4, the holes 41, the first dam 31, the second dam 32, and the interlayer dielectric layer 13. Furthermore, an organic packaging layer 52 and a second inorganic packaging layer 53 are coated on the first inorganic packaging layer 51.

In the first embodiment and in this embodiment, the width of the holes 41 along the extension direction of the dam 3 is 5 μm to 500 μm. An interval of the two adjacent holes 41 along the extension direction of the dam 3 is greater than 10 μm. The length of the holes 41 in the direction from the display region 10 toward the peripheral region 20 is greater than 5 μm. The size design of the holes 41 can ensure that the anode 4 of the peripheral region 20 is functionally connected to the common ground voltage VSS of the circuit without voltage potential loss.

A Display Panel of a Third Embodiment

Please refer to 6a and 6b. The difference between this embodiment and the first embodiment is that the holes 41 are provided on the anode 4. The holes 41 correspond to the connection of the first dam 31, the separate region 33, and the second dam 32. The first inorganic packaging layer 51 of the thin-film packaging layer 5 exposes the first dam 31 and the second dam 32, and the separate region 33 through the holes 41. In the extension of the holes to the second dam 32, the first inorganic packaging layer 51 is in contact with the anode 4, the source drain layer 2, the first inorganic layer 34 of the dam 3, the second inorganic layer 35, and the interlayer dielectric layer 13. In other embodiments, the second hole 21 is provided on the source drain layer 2 corresponding to the holes 41 of the anode 4.

Figure 6A:
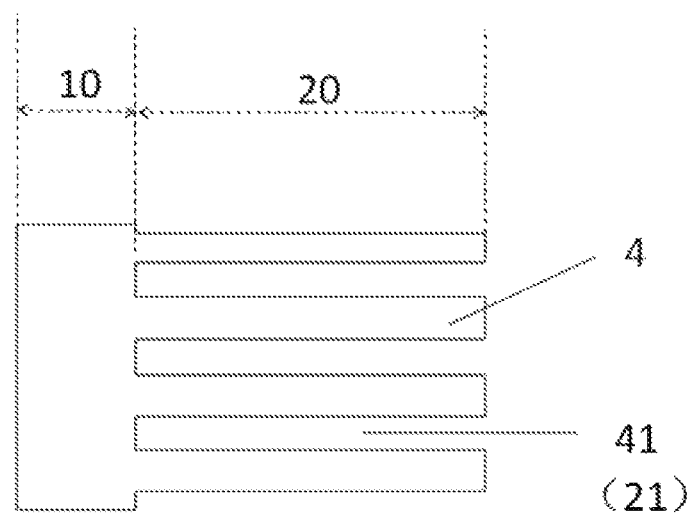
FIG. 6a illustrates a top view of an anode of a third embodiment of the present disclosure.
Figure 6B:
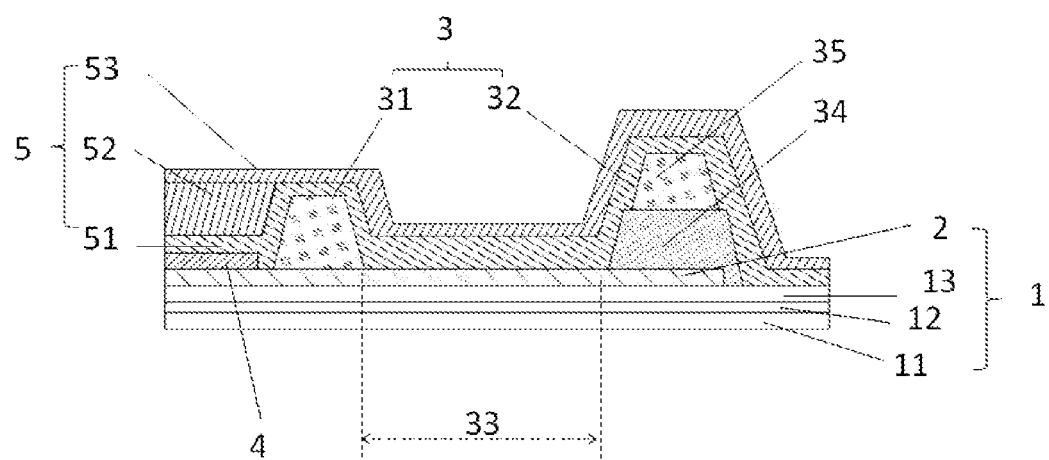

In this embodiment, the manufacturing processes of the display panel are similar to the manufacturing processes of the display panel of the first embodiment. The differences are that the anode 4, as shown in FIG. 6a and FIG. 6b, corresponding to the first dam 31 and the second dam 32 requires the holes to be etched in the region of the dam 3, especially near the steps, so that the anode 4, which is originally deposited as an entire surface, extends as a wire to a boundary of the peripheral region 20. More particularly, the size of the holes 41 along the extension direction of the dam 3 is greater than 5 µm. The interval of the two adjacent holes 41 along the extension direction of the dam 3 is greater than 110 µm.

The size of the holes 41 of the anode 4 becomes larger and the number of the holes 41 becomes smaller. The anode 4 extends as a wire near the dam 3 to the peripheral region 20 facing away the boundary of the display region 10 so that the etching process and the design of the mask can be greatly simplified and the etching yield of the holes 41 of the anode 4 can be significantly improved. The size design of the holes 41 can ensure that the anode of the peripheral region 20 is functionally connected to VSS without voltage potential loss.

In the present disclosure, the first embodiment, the second embodiment, and this embodiment, the shapes of the holes 41 of the anode 4 may be linear, and shapes of the holes 41 in other embodiments may be curved or polyline-shaped, which are not specifically limited here.

To conclude, in the present disclosure, the anode 4 is patterned by exposure, etching, or other processes after the anode 4 is formed as an entire surface. For example, with a hole design or a wire design, the first inorganic packaging layer 31 of the thin-film packaging layer 5 is in contact with the first inorganic layer 34 of the dam 3 and the second inorganic layer 35 or is alternatively in contact with the interlayer dielectric layer 13 of the substrate 1 through the holes 41 of the anode 4 or the second hole 21 of the source drain layer 2. This leads to that the interface adhesion between the inorganic film layers is much greater than the interface adhesion between the inorganic film layer and the metal film layer. In addition, the first inorganic packaging layer 51 of the thin-film packaging layer 5 is in contact with the source drain layer 2 of the substrate 1, which can effectively prevent the anode 4 from peeling near the dam 3, especially at the slope region so that the problems of pixel shrinkage caused by the edge peeling extending to the display region 10 are prevented. Furthermore, diffusion of a partial peeling phenomenon is prevented. That is, the holes 41 of the anode 4 and the second hole 21 of the source drain layer 2 can inhibit the partial peeling of the dam 3 from further extending to the display region 10. Thereby, the high reliability for packaging effect of the organic light-emitting device is enhanced.

It should be noted that for a skill person in the art, substitutions or modifications can be obtained according to the technical solutions and aspects of the present disclosure fall within the protected scopes of the claims of the present disclosure.

What is claimed is:

1. A display panel, comprising a display region and a peripheral region surrounding the display region, wherein the display panel comprises:
    a substrate;
    at least one dam disposed on the substrate and disposed in the peripheral region;
    an anode disposed on the substrate, wherein a plurality of holes are provided on the anode in the peripheral region to expose the dam, the plurality of holes are arranged along an extending direction of the dam, the holes are arranged in a line or in a staggered manner along a direction extending from the display region toward the peripheral region, and a size of the holes is greater than a size of the dam in the direction extending from the display region toward the peripheral region; and
    a second hole provided on a source drain layer of the substrate, wherein the second hole corresponds to the holes on the anode.

2. The display panel according to claim 1, wherein the dam comprises at least a first dam and a second dam, the first dam is disposed between the display region and the second dam, and a separate region is defined between the first dam and the second dam.

3. The display panel according to claim 2, wherein the display panel further comprises a thin-film packaging layer, and a first inorganic packaging layer of the thin-film packaging layer contacts the dam through the holes and the second hole.

4. The display panel according to claim 1, wherein a size of the holes along the extending direction of the dam is 5 µm-500 µm, the size of the holes in the direction extending from the display region toward the peripheral region is greater than 5 µm, and an interval between two adjacent ones of the holes along the extending direction of the dam is greater than 10 µm.

5. The display panel according to claim 2, wherein the dam comprises a first inorganic layer and a second inorganic layer stacked on each other.

6. A display panel, comprising a display region and a peripheral region surrounding the display region, wherein the display panel comprises:
    a substrate;
    at least one dam disposed on the substrate and disposed in the peripheral region; and
    an anode disposed on the substrate, wherein at least one of holes is provided on the anode in the peripheral region to expose the dam, and a size of the hole is greater than a size of the dam in a direction extending from the display region toward the peripheral region.

7. The display panel according to claim 6, wherein the dam comprises at least a first dam and a second dam, the first dam is disposed between the display region and the second dam, and a separate region is defined between the first dam and the second dam.

8. The display panel according to claim 7, wherein the display panel further comprises a thin-film packaging layer, and a first inorganic packaging layer of the thin-film packaging layer contacts the dam through the hole.

9. The display panel according to claim 8, wherein a second hole is provided on a source drain layer of the substrate and corresponds to the holes on the anode, and the first inorganic packaging layer of the thin-film packaging layer contacts the dam through the hole and the second hole.

10. The display panel according to claim 9, wherein a plurality of the holes are arranged along an extending direction of the dam, the holes are arranged in a line or in a staggered manner along the direction extending from the display region toward the peripheral region.

11. The display panel according to claim 10, wherein a size of the holes along the extending direction of the dam is 5 μm-500 μm, a size of the holes in the direction extending from the display region toward the peripheral region is greater than 5 μm, and an interval between two adjacent ones of the holes along the extending direction of the dam is greater than 10 μm.

12. The display panel according to claim 10, wherein a size of the holes along the extending direction of the dam is greater than 5 μm, and an interval between two adjacent ones of the holes along the extending direction of the dam is greater than 10 μm.

13. The display panel according to claim 9, wherein the dam comprises a first inorganic layer and a second inorganic layer stacked to each other.

14. The display panel according to claim 13, wherein the display panel further comprises a planarization layer, a pixel defining layer, and an organic light-emitting layer stacked on each other in the display region, the planarization layer and the first inorganic layer of the dam are disposed in a same layer and have a same material, the pixel defining layer and the second inorganic layer of the dam are disposed in a same layer and have a same material, the organic light-emitting layer comprises the anode, a light-emitting layer, and a cathode stacked on each other, the substrate comprises a base substrate, a gate insulation layer, an interlayer dielectric layer, and the source drain layer stacked on each other in the peripheral region, and the planarization layer covers the source drain layer.

15. The display panel according to claim 8, wherein the thin-film packaging layer further comprises at least an organic packaging layer and a second inorganic packaging layer and the organic packaging layer and the second inorganic packaging layer are disposed on a side of the first inorganic packaging layer of the thin-film packaging layer away from the substrate.

* * * * *